United States Patent
Sasaki et al.

(10) Patent No.: US 10,242,977 B2
(45) Date of Patent: Mar. 26, 2019

(54) FLUID-SUSPENDED MICROCOMPONENT HARVEST, DISTRIBUTION, AND RECLAMATION

(71) Applicant: eLux Inc., Camas, WA (US)

(72) Inventors: Kenji Sasaki, West Lynn, OR (US); Paul J. Schuele, Washougal, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 15/838,536

(22) Filed: Dec. 12, 2017

(65) Prior Publication Data
US 2018/0102352 A1 Apr. 12, 2018

Related U.S. Application Data

(63) Continuation-in-part of application No. 15/722,037, filed on Oct. 2, 2017, which is a continuation-in-part (Continued)

(51) Int. Cl.
*H01L 25/00* (2006.01)
*H01L 33/00* (2010.01)
*H01L 27/15* (2006.01)

(52) U.S. Cl.
CPC ............ *H01L 25/50* (2013.01); *H01L 27/153* (2013.01); *H01L 33/007* (2013.01);
(Continued)

(58) Field of Classification Search
CPC ..... H01L 25/50; H01L 27/153; H01L 33/007; H01L 2224/75655; H01L 2224/76733; H01L 2224/95144
See application file for complete search history.

(56) References Cited

U.S. PATENT DOCUMENTS 5,249,733 A 10/1993 Brady et al.
5,545,291 A 8/1996 Smith et al.
(Continued)

OTHER PUBLICATIONS

E. Feldtkeller, Review on domains in Thin Magnetic Samples, J. Phys. Colloques 1971, 32, C1-452.
(Continued)

*Primary Examiner* — Sitaramarao S Yechuri
(74) *Attorney, Agent, or Firm* — Law Office of Gerald Maliszewski; Gerald Maliszewski

(57) ABSTRACT

Fluid-suspended microcomponent management systems and methods are provided. The method provides a first reservoir containing a first solution and a magnetic collection head. A plurality of magnetically polarized microcomponents is suspended in the first solution, where each microcomponent has a maximum cross-section of 150 micrometers (μm) and a maximum mass of 1 microgram. A magnetic field is induced in the collection head and the microcomponents are exposed to the magnetic field. A plurality of microcomponents becomes fixed in position on a collection surface in response to the magnetic field. In one aspect, the step of exposing the microcomponents to the magnetic field includes immersing the collection head in the first reservoir. As a result, the plurality of microcomponents is collected on a surface of the collection head. Alternatively, the step of fixing the plurality of microcomponents in position includes fixing the microcomponents in position on the collection surface sidewall.

33 Claims, 10 Drawing Sheets

Related U.S. Application Data of application No. 15/691,976, filed on Aug. 31, 2017, which is a continuation-in-part of application No. 15/440,735, filed on Feb. 23, 2017, which is a continuation-in-part of application No. 15/416,882, filed on Jan. 26, 2017, which is a continuation-in-part of application No. 15/413,053, filed on Jan. 23, 2017, which is a continuation-in-part of application No. 15/412,731, filed on Jan. 23, 2017, which is a continuation-in-part of application No. 15/410,195, filed on Jan. 19, 2017, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,266, filed on Jun. 29, 2016, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, now Pat. No. 10,115,862, which is a continuation-in-part of application No. 14/530,230, filed on Oct. 31, 2014, now abandoned.

(52) U.S. Cl.
CPC ............... *H01L 2224/75655* (2013.01); *H01L 2224/76733* (2013.01); *H01L 2224/95144* (2013.01)

(56) References Cited

U.S. PATENT DOCUMENTS

| | | |
|---|---|---|
| 5,594,463 A | 1/1997 | Sakamoto |
| 5,824,186 A | 1/1998 | Smith et al. |
| 5,904,545 A | 5/1999 | Smith et al. |
| 6,274,508 B1 | 8/2001 | Jacobsen et al. |
| 6,281,038 B1 | 8/2001 | Jacobsen et al. |
| 6,316,278 B1 | 11/2001 | Jacobsen et al. |
| 6,417,025 B1 | 7/2002 | Gengel |
| 6,420,266 B1 | 7/2002 | Smith et al. |
| 6,468,638 B2 | 11/2002 | Jacobsen et al. |
| 6,479,395 B1 | 11/2002 | Smith et al. |
| 6,507,989 B1 | 1/2003 | Bowden et al. |
| 6,527,964 B1 | 3/2003 | Sakariya et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,247 B2 | 8/2003 | Credelle et al. |
| 6,613,610 B2 | 9/2003 | Iwafuchi et al. |
| 6,618,030 B2 | 9/2003 | Kane et al. |
| 6,623,579 B1 | 9/2003 | Smith et al. |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,687,987 B2 | 2/2004 | Mayer et al. |
| 6,723,576 B2 | 4/2004 | Nozawa et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,825,499 B2 | 11/2004 | Nakajima et al. |
| 6,850,312 B2 | 2/2005 | Jacobsen et al. |
| 6,863,219 B1 | 3/2005 | Jacobsen et al. |
| 6,870,190 B2 | 3/2005 | Okuyama et al. |
| 6,919,225 B2 | 7/2005 | Craig et al. |
| 6,927,085 B2 | 8/2005 | Hadley et al. |
| 6,980,184 B1 | 12/2005 | Stewart et al. |
| 6,984,927 B2 | 1/2006 | Tomoda et al. |
| 6,985,361 B2 | 1/2006 | Credelle et al. |
| 7,046,328 B2 | 5/2006 | Jacobsen et al. |
| 7,049,207 B2 | 5/2006 | Tomoda |
| 7,049,227 B2 | 5/2006 | Tomoda et al. |
| 7,060,542 B2 | 6/2006 | Nakajima et al. |
| 7,070,851 B2 | 7/2006 | Jacobsen et al. |
| 7,080,444 B1 | 7/2006 | Craig et al. |
| 7,087,934 B2 | 8/2006 | Oohata et al. |
| 7,101,502 B2 | 9/2006 | Smith et al. |
| 7,113,250 B2 | 9/2006 | Jacobsen et al. |
| 7,122,826 B2 | 10/2006 | Okuyama et al. |
| 7,129,514 B2 | 10/2006 | Okuyama et al. |
| 7,141,176 B1 | 11/2006 | Smith et al. |
| 7,172,789 B2 | 2/2007 | Smith et al. |
| 7,179,210 B2 | 2/2007 | Soukeras |
| 7,199,527 B2 | 4/2007 | Holman |
| 7,217,592 B2 | 5/2007 | Nuggehalli et al. |
| 7,244,326 B2 | 7/2007 | Craig et al. |
| 7,250,314 B2 | 7/2007 | Nakajima et al. |
| 7,250,320 B2 | 7/2007 | Lai et al. |
| 7,260,882 B2 | 8/2007 | Credelle et al. |
| 7,288,432 B2 | 10/2007 | Jacobsen et al. |
| 7,317,211 B2 | 1/2008 | Watanabe et al. |
| 7,317,435 B2 | 1/2008 | Hsueh |
| 7,321,159 B2 | 1/2008 | Schatz |
| 7,353,598 B2 | 4/2008 | Craig et al. |
| 7,417,306 B1 | 8/2008 | Jacobsen et al. |
| 7,425,467 B2 | 9/2008 | Jacobsen et al. |
| 7,452,748 B1 | 11/2008 | Craig et al. |
| 7,500,610 B1 | 3/2009 | Hadley et al. |
| 7,531,218 B2 | 5/2009 | Smith et al. |
| 7,542,301 B1 | 6/2009 | Liong et al. |
| 7,561,221 B2 | 7/2009 | Jacobsen et al. |
| 7,564,064 B2 | 7/2009 | Oohata et al. |
| 7,572,649 B2 | 8/2009 | Kanemitsu et al. |
| 7,573,194 B2 | 8/2009 | Doi et al. |
| 7,576,656 B2 | 8/2009 | Craig et al. |
| 7,589,355 B2 | 9/2009 | Tomoda et al. |
| 7,615,479 B1 | 11/2009 | Craig et al. |
| 7,619,598 B2 | 11/2009 | Pulvirenti et al. |
| 7,662,008 B2 | 2/2010 | Hillis et al. |
| 7,723,764 B2 | 5/2010 | Oohata et al. |
| 7,763,901 B2 | 7/2010 | Tomoda |
| 7,774,929 B2 | 8/2010 | Jacobs |
| 7,795,049 B2 | 9/2010 | Watanabe et al. |
| 7,795,629 B2 | 9/2010 | Watanabe et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,927,976 B2 | 4/2011 | Menard |
| 7,931,063 B2 | 4/2011 | Craig et al. |
| 7,968,474 B2 | 6/2011 | Martin et al. |
| 7,977,130 B2 | 7/2011 | Hillis et al. |
| 8,068,661 B2 | 11/2011 | Onushkin et al. |
| 8,101,457 B2 | 1/2012 | Tomoda et al. |
| 8,138,868 B2 | 3/2012 | Arnold |
| 8,222,659 B2 | 7/2012 | Tomoda |
| 8,232,640 B2 | 7/2012 | Tomoda et al. |
| 8,252,164 B2 | 8/2012 | Martin et al. |
| 8,257,538 B2 | 9/2012 | Doi et al. |
| 8,284,120 B2 | 10/2012 | Hillis et al. |
| 8,300,007 B2 | 10/2012 | Hillis et al. |
| 8,312,619 B2 | 11/2012 | Chow et al. |
| 8,333,860 B1 | 12/2012 | Bibl et al. |
| 8,349,116 B1 | 1/2013 | Bibl et al. |
| 8,361,268 B2 | 1/2013 | Mizuno et al. |
| 8,361,297 B2 | 1/2013 | Mayer et al. |
| 8,379,003 B2 | 2/2013 | Kawaguchi et al. |
| 8,382,544 B2 | 2/2013 | Hillis et al. |
| 8,383,506 B1 | 2/2013 | Golda et al. |
| 8,384,116 B2 | 2/2013 | Ohtorii et al. |
| 8,390,537 B2 | 3/2013 | Hillis et al. |
| 8,409,886 B2 | 4/2013 | Iwafuchi et al. |
| 8,415,767 B1 | 4/2013 | Golda et al. |

(56) References Cited

U.S. PATENT DOCUMENTS

| | | |
|---|---|---|
| 8,415,768 B1 | 4/2013 | Golda et al. |
| 8,415,771 B1 | 4/2013 | Golda et al. |
| 8,415,879 B2 | 4/2013 | Lowenthal et al. |
| 8,426,227 B1 | 4/2013 | Bibl et al. |
| 8,476,826 B2 | 7/2013 | Oohata et al. |
| 8,518,204 B2 | 8/2013 | Hu et al. |
| 8,552,436 B2 | 10/2013 | Bibl et al. |
| 8,558,243 B2 | 10/2013 | Bibl et al. |
| 8,569,115 B1 | 10/2013 | Golda et al. |
| 8,570,482 B2 | 10/2013 | Hillis et al. |
| 8,573,469 B2 | 11/2013 | Hu et al. |
| 8,628,994 B2 | 1/2014 | Tomoda |
| 8,683,416 B1 | 1/2014 | Trivedi et al. |
| 8,646,505 B2 | 2/2014 | Bibl et al. |
| 8,648,328 B2 | 2/2014 | Crowder et al. |
| 8,669,703 B2 | 3/2014 | Hillis et al. |
| 8,685,774 B2 | 4/2014 | Crowder et al. |
| 8,686,447 B2 | 4/2014 | Tomoda et al. |
| 8,686,542 B2 | 4/2014 | Golda et al. |
| 8,711,063 B2 | 4/2014 | Hillis et al. |
| 8,789,573 B2 | 7/2014 | Bibl et al. |
| 8,809,126 B2 | 8/2014 | Lowenthal et al. |
| 8,846,457 B2 | 9/2014 | Lowenthal et al. |
| 8,906,713 B2 | 12/2014 | Rettke |
| 9,240,397 B2 | 1/2016 | Bibl et al. |
| 9,245,875 B2 | 1/2016 | Karlicek et al. |
| 9,252,375 B2 | 2/2016 | Bibl et al. |
| 9,269,322 B2 | 2/2016 | Nathan et al. |
| 9,293,476 B2 | 3/2016 | Nathan et al. |
| 9,305,807 B2 | 4/2016 | Whiting et al. |
| 9,318,475 B2 | 4/2016 | Bibl et al. |
| 9,343,448 B2 | 5/2016 | Sakariya et al. |
| 9,666,766 B2 | 5/2017 | Kurtin et al. |
| 2002/0153606 A1 | 10/2002 | Gengel |
| 2005/0206585 A1 | 9/2005 | Stewart et al. |
| 2005/0233504 A1 | 10/2005 | Doi et al. |
| 2008/0121724 A1* | 5/2008 | Beer ............... G06K 19/07718 235/492 |
| 2008/0265367 A1* | 10/2008 | Tan ........................ H01L 24/81 257/531 |
| 2010/0122654 A1* | 5/2010 | Sharma ................... H01L 24/95 118/69 |
| 2010/0186883 A1 | 7/2010 | Tomoda |
| 2011/0266039 A1 | 11/2011 | Tomoda |
| 2011/0271905 A1* | 11/2011 | Ivanov ............. H01L 21/67051 118/612 |
| 2011/0273410 A1 | 11/2011 | Park et al. |
| 2011/0300668 A1* | 12/2011 | Parvarandeh ........... H01L 24/95 438/107 |
| 2012/0169786 A1 | 7/2012 | Okuyama et al. |
| 2012/0218318 A1 | 8/2012 | Hirao et al. |
| 2013/0126098 A1 | 5/2013 | Bibl et al. |
| 2013/0126827 A1 | 5/2013 | Bibl et al. |
| 2013/0128585 A1 | 5/2013 | Bibl et al. |
| 2013/0210194 A1 | 8/2013 | Bibl et al. |
| 2013/0302935 A1* | 11/2013 | Dai ........................ H01L 35/34 438/54 |
| 2014/0008691 A1 | 1/2014 | Tomoda et al. |
| 2014/0048909 A1 | 2/2014 | Golda et al. |
| 2014/0084482 A1 | 3/2014 | Hu et al. |
| 2014/0117311 A1 | 5/2014 | Kurtin |
| 2014/0277680 A1 | 9/2014 | Youngquist |
| 2015/0155445 A1 | 6/2015 | Zhan et al. |
| 2015/0179877 A1 | 6/2015 | Hu et al. |
| 2015/0214430 A1 | 7/2015 | Zhan et al. |
| 2015/0263066 A1 | 9/2015 | Hu et al. |
| 2016/0086534 A1 | 3/2016 | Seo et al. |
| 2017/0062393 A1 | 3/2017 | Kim |
| 2017/0229330 A1 | 8/2017 | Tkachenko et al. |

OTHER PUBLICATIONS

Park, S.-C., et al., A First Implementation of an Automated Reel-to-Reel Fluidic Self-Assembly Machine, Adv. Mater., 2014 26: 5942-5949.
Gach et al., Transparent Magnetic Photoresists for Bioanalytical Applications, Biomaterials, Nov. 2010; 31 (33): 8810-8817.
Zhang et al., Magnetic-Field-Based Self-Assembly, Encylopedia of Nanotechnology, 1264-1275.
Plouffe et al., Fundamentals and Application of Magnetic Particles in Cell Isolattion and Enrichment, Rep Prog Phys. Jan. 2015; 78(1).
U.S. Appl. No. 14/749,569, Sasaki et al.
U.S. Appl. No. 15/221,571, Crowder et al.
U.S. Appl. No. 15/190,813, Schuele et al.
U.S. Appl. No. 15/158,556, Zhan et al.
U.S. Appl. No. 15/266,796, Heine et al.
U.S. Appl. No. 14/305,295, LED Display Driving Circuits.
Knuesel et al., "Self-assemby of microopic chiplets at a liquid-liquid-solid interface . . . ", PNAS, Jan. 19, 2010, vol. 107, No. 3, 993-998.
Mastrangeli et al., "Self-assemby from milli- to nanoscales: methods and applications", J Micromech Microeng, Jul. 8, 2009; 19(8): 083001.
Steven F. Lee, Mark A. Osborne "Brightening, Blinking, Bluing and Bleaching in the Life of a Quantum Dot: Friend or Foe?", ChemPhysChem 10(13):2174-91.
Bui, Thanh Son, et al. "High optical density and low dielectric constant black matrix containing graphene oxide and carbon black . . . " Displays 34.3 (2013): 192-199.

* cited by examiner

FLUID-SUSPENDED MICROCOMPONENT HARVEST, DISTRIBUTION, AND RECLAMATION

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to fluidic assembly systems and methods and, more particularly, to systems and methods for the handling of microcomponents using magnetic fields.

2. Description of the Related Art

Fluidic assembly uses a series of fabrication processes that manipulate the position of microcomponents to economically manufacture large area arrays of, for example, micro light emitting diodes ($\mu$LEDs). The central technique is the assembly step where components are positioned on a product substrate, but there are many other processes involved as follows:
1) Prepare the microcomponents by conventional microfabrication and singulate;
2) Harvest and clean the microcomponents;
3) Formulate a suspension of microcomponents suitable for fluidic assembly;
4) Dispense the microcomponent suspension onto the product substrate;
5) Perform fluidic assembly to position microcomponents in the array;
6) Clean off excess microcomponents and collect them for recycling;
7) Inspect the array yield and perform any touch-up assembly to correct low fill regions;
8) Dry the substrate;
9) Anneal to form an electrical bond between the microcomponent and electrodes on the product substrate; and,
10) Inspect the array and repair any non-functioning sites.

It can be seen that many of these steps can benefit from methods of moving, positioning, and holding microcomponents selectively.

Given how universal the topic of suspension handling is for fluidic self-assembly, it is remarkable how little has been published on the handling aspects of microcomponent suspensions for fluidic assembly. Park et al. (Adv. Mater., 26: 5942-5949) designed a circulating system to recycle mm-scale self-assembling LEDs, but no applicable reference material appears to exist describing techniques to maximize microcomponent utilization through handling suspensions before and after assembly itself.

Industrial handling of suspensions of low-value material, such as chemical-mechanical planarization (CMP) slurry, is a mature field. Laboratory-scale handling of suspensions of cells is similarly well-developed. Efficient handling of suspensions of high-value, dense, micron-scale, and fragile unpackaged components is in contrast, a topic with little development thus far.

It would be advantageous if selective external forces could be applied to microcomponent handling including singulation into suspension, transfer to assembly substrate, assembly, cleanoff, testing of known good die, repair, and bonding to the final substrate.

SUMMARY OF THE INVENTION

Disclosed herein are systems and methods implementing a magnetic dipole on microcomponents used in fluidic assembly, as well as the handling methods that become available from sensitizing the microcomponents to a magnetic force that has little effect on the other materials in the process, such as assembly fluid, nonmagnetic defect particles, assembly substrate, tubing, etc. The process flow for fluidic assembly is unusual in that high-value components are processed on a mother substrate and then singulated into suspension for later assembly. Access to these arrayed components prior to singulation allows deliberate manipulation of their magnetic susceptibility and creation of a controlled dipole on these asymmetric but low-inertia structures. Given the ability to tune the dipole and selectively exert non-contact force, a wide range of capabilities become accessible. The methods outlined are impactful not just for assembly, but for every stage of microcomponent handling. Briefly the stages of microcomponent handling include:
1) After growth and singulation the microcomponents may be magnetically held against processes such as chemical treatment, sweeping away soluble and insoluble residue from fabrication and processing, enabling a solvent exchange to a selected assembly fluid, and binning the suspension into magnetically susceptible and insusceptible populations.
2) Transfer from a suspension source reservoir using an electromagnetic distribution head that can deposit controlled quantities of microcomponents at a desired point or distributed over a region.
3) A control method to capture unassembled microcomponents that are swept to the edge of substrate assembly regions that may be used with any assembly approach.
4) A method to remove microcomponents from the assembly substrate without causing damage or contacting the substrate by using an electromagnetic pickup head. Collected microcomponents can then be re-deposited into a supply reservoir after cleaning or re-dispensed on an assembly substrate.

Accordingly, a fluid-suspended microcomponent management method is provided. The method provides a first reservoir containing a first solution and an electromagnetic collection head. A plurality of magnetically polarized microcomponents are suspended in the first solution, where each microcomponent has a maximum cross-section of 150 micrometers ($\mu$m) and a maximum mass of 1 microgram. A magnetic field is induced in the collection head and the microcomponents are exposed to the magnetic field. A plurality of microcomponents becomes fixed in position on a collection surface in response to the magnetic field. In one aspect, the step of exposing the microcomponents to the magnetic field includes immersing the collection head in the first reservoir. As a result, the plurality of microcomponents is collected on a surface of the collection head. Alternatively, the first reservoir may have a collection surface sidewall, and the step of fixing the plurality of microcomponents in position includes locating the collection head adjacent to the collection surface sidewall and fixing the microcomponents in position on the collection surface sidewall.

Typically, the microcomponents include a planar soft ferromagnetic layer with a thickness in the range of 50 to 2000 nanometers (nm). Depending on the type of soft ferromagnetic layer material, layer thickness, and geometry, the magnetic polarization is either aligned in parallel with the soft ferromagnetic layer or orthogonal to the soft ferromagnetic layer. Thus, depending on microcomponent polarization, the step of collecting the microcomponents on the collection surface includes collecting the soft ferromagnetic layers of the microcomponents in an orientation that is either parallel with or orthogonal to a planar collection surface. Typically, the microcomponents are arranged on the collection surface as a sub-layer (partial layer), made up of microcomponents with soft ferromagnetic layers having a parallel magnetic polarization, or multiple layers, made up of microcomponents with soft ferromagnetic layers having an orthogonal magnetic polarization.

Subsequent to collecting the plurality of microcomponents on the collection head surface, the method may transfer the collection head from the first reservoir to a second reservoir containing a second solution. Then, the microcomponents become suspended in the second solution in response to interrupting the magnetic field. The field may be interrupted by canceling the field, reversing the polarity of the magnetic field, or selectively de-energizing by using an oscillating magnetic field having a first frequency, first amplitude, and first duty cycle.

In another aspect, the first reservoir that is provided may include contaminants, some of which may adhere to the microcomponents, and the method may rinse the collection surface with a third solution to remove the contaminants. Simultaneous with rinsing the collection surface, a force may be applied to the collection surface, such as a vibration or magnetic field oscillation, to aid in the removal of the contaminants.

In one other aspect, the first reservoir that is provided may include a substrate at least partially submerged in the first solution, with the substrate having a plurality of microcomponent wells formed in a substrate surface. Then, prior to collecting the plurality of microcomponents, a solution-based assembly process is performed to seat microcomponents in the wells. Unseated microcomponents are accumulated in the first reservoir, and the step of collecting the plurality of microcomponents on the collection head surface includes collecting the unseated microcomponents using the magnetic field.

In another variation, the step of providing the first reservoir includes providing a first reservoir with an inlet port and an outlet port, and introducing a solution to the first reservoir. In this step other solutions may also be added (and removed) in combination with the first solution or after the first solution. Further, the solutions may be added (or removed) at any stage in the process. Some examples of solution components include alcohols, ketones, alkanes, organic acids, and water. Similarly, the method may drain the first reservoir of solution so as to expose the microcomponents fixed on the collection surface to an environment such as ambient air, vacuum, vapor-phase organic acids, or oxygen plasma.

Additional details of the above-described method and a system for the distribution and management of magnetically polarized microcomponents in solution are provided below.

DETAILED DESCRIPTION

Figure 1:
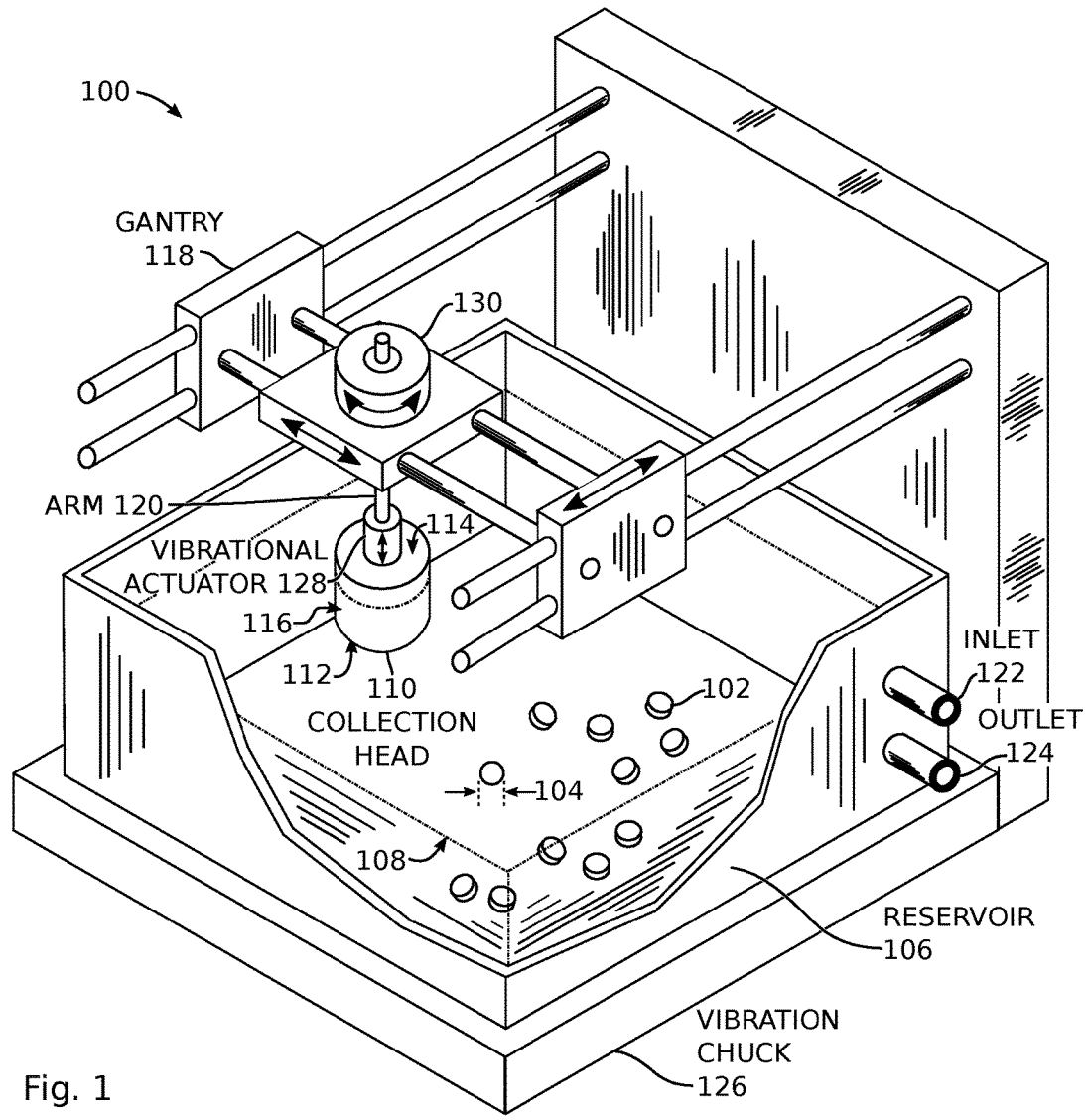
FIG. 1 is a diagram depicting a system for the distribution of magnetically polarized microcomponents.

FIG. 1 is a diagram depicting a system for the distribution of magnetically polarized microcomponents. The system 100 comprises magnetically polarized microcomponents 102. Each microcomponent has a maximum cross-section 104 of 150 micrometers (μm) and a maximum mass of 1 microgram. Here, the microcomponents 102 are depicted as having a disk shape. Typically, the microcomponents are planar, but they need not be circular (disk-shaped). For example, the microcomponents may have an oblong or asymmetrical shape. The system 100 further comprises a reservoir 106 containing a solution 108. A collection head 110, typically electromagnetic but optionally a permanently magnetized, has a proximal end 112, a distal end 114, and a surface 116 to enable the magnetic capture and release of the microcomponents 102 in the solution 108. As shown, the electromagnetic collection head 110 is capable of immersion in the solution 108. As explained in greater detail below, microcomponents 102 in solution 108 may become magnetically captured on the collection head surface 116 in response to the induced magnetic field, or microcomponents captured on surface 116 may be released into the solution 108 by interrupting the electromagnetic field. A gantry 118 has an arm 120 attached to the distal end 114 of the electromagnetic collection head, capable of moving the electromagnetic collection head in horizontal and vertical directions. That is, the gantry 118 enables the electromagnetic collection head 110 to move in all three orthogonal directions. The electromagnetic collection head 110 may induce a magnetic field having a first frequency, first amplitude, and first duty cycle. Variations in the frequency, amplitude, and duty cycle may aid in the acquisition or release of magnetically captured microcomponents 102.

In one aspect, as shown, the reservoir 106 comprises an inlet port 122 to supply solution at a controlled rate and volume, and an outlet port 124 to drain solution. The inlet port 122 and outlet port 124 permit solution to be cycled, or the type of solution to be changed. Further, the solution 108 may be capable of creating shearing forces on magnetically captured microcomponents 102 to remove weakly attached microcomponents and debris. Other potential features include a vibration chuck 126 underlying the reservoir 106, and a vibrational actuator 128 associated with the gantry 118. As shown, the vibrational actuator 128 is attached to arm 118. The vibration chuck 126 and vibrational actuator 128 may be used to create shearing forces to remove magnetically captured microcomponents that are weakly held, aid in the release of microcomponents after the magnetic field is interrupted, or to aid in the magnetic capture of microcomponents 102 by agitating the solution 108. One other optional feature associated with the gantry 118 is a rotating member 130 connected to the arm 120 of the gantry 118.

Figure 2B:
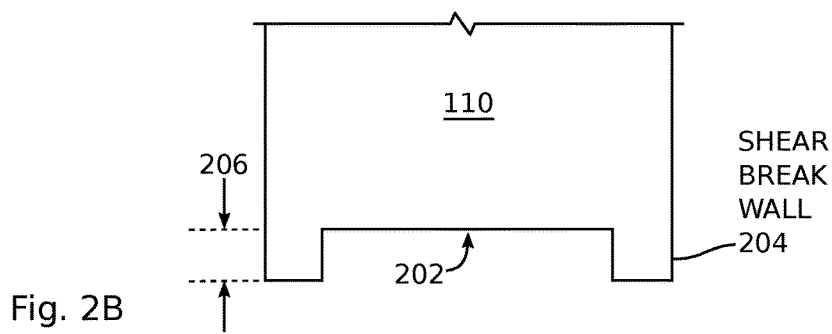
FIGS. 2A and 2B are diagrams depicting variations of the distribution system of FIG. 1.
Figure 2A:
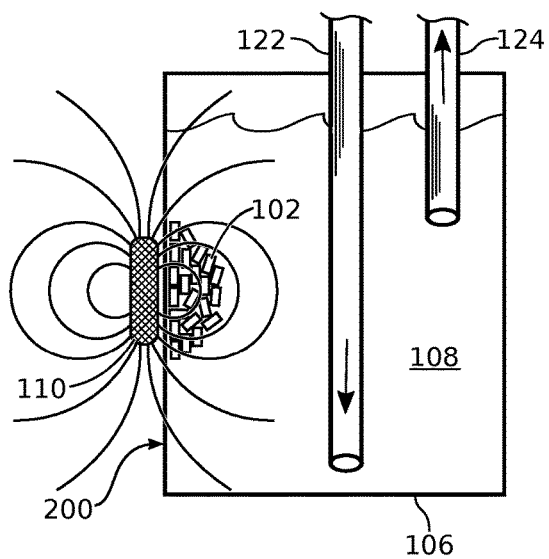

FIGS. 2A and 2B are diagrams depicting variations of the distribution system of FIG. 1. In FIG. 2A, rather than immersing the collection head 110 in the solution 108, an electro or permanent magnetic collection head magnetically captures microcomponents 102 against an interposing sidewall 200 of the reservoir 106.

FIG. 2B is a partial cross-sectional view of the electromagnetic collection head proximal end 112 with a bottom surface 202 and a shear break wall 204 formed around a perimeter of the proximal end bottom surface. As shown, the electromagnetic collection head bottom surface 202 is planar and the shear break wall 204 has a height 206 in the range of 3 to 10,000 microns (μm). The surface area surrounded by the perimeter and the height of the shear break wall 204 define a volume that determines the number of microcomponents that can be captured in the volume. In some aspects not shown, the proximal end bottom surface is either convex or concave. Additionally, the shear break wall may include interior segments that device the volume into sub-volumes, creating a waffle-like appearance.

Figure 3A:
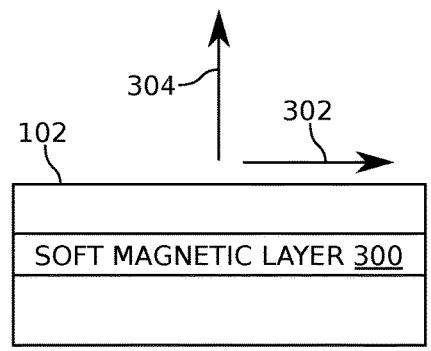
FIGS. 3A through 3C are partial cross-sectional views of an exemplary microcomponent and microcomponent alignments.
Figure 3B:
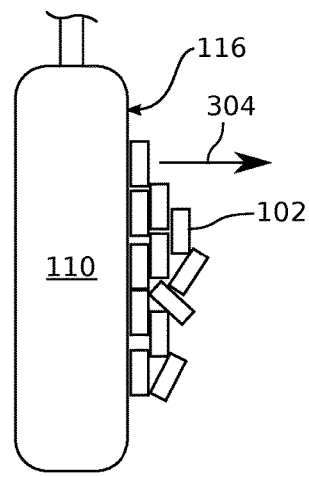
Figure 3C:
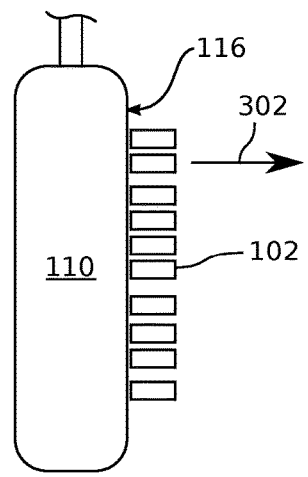

FIGS. 3A through 3C are partial cross-sectional views of an exemplary microcomponent and microcomponent alignments. The microcomponent 102 in this example has a planar soft ferromagnetic layer 300, and a magnetic polarization that is either aligned in parallel with the soft ferromagnetic layer, as represented by reference designator 302, or orthogonal to the soft ferromagnetic layer, as represented by reference designator 304. A soft ferromagnetic material is capable of becoming magnetically polarized, but once away from the influence of an external field, loses it magnetic polarization relatively quickly. For ferromagnetic materials, coercivity is the intensity of the applied magnetic field required to reduce the magnetization of that material to zero after the magnetization of the sample has been driven to saturation. Remanent magnetization or residual magnetism is the magnetization left behind in a magnetized material after an external magnetic field is removed. For example, the soft ferromagnetic material may be nickel (Ni) or 3 to 10% iron (Fe)—Ni alloy. In some aspects, a paramagnetic material may be suitable. Depending on the microcomponent polarization direction (302 or 304) and the directionality of the magnetic field, the electromagnetic collection head 110 magnetically captures the soft ferromagnetic layers 300 of the microcomponents 102 in an orientation that is either parallel with the collection head surface 116, as shown in FIG. 3B, or orthogonal to the electromagnetic collection head surface, as shown in FIG. 3C. The electromagnetic collection head surface 116 may magnetically capture microcomponents in a sub-layer orientation made up of microcomponents with soft ferromagnetic layers 300 having a parallel magnetic polarization 302 (FIG. 3C), or multiple layers, made up of microcomponents with soft ferromagnetic layers having an orthogonal magnetic polarization 304 (FIG. 3B).

As an alternative to a metal film layer, a magnetic layer may be formed from a magnetically susceptible transparent structure by suspending magnetic particles in SU-8, a photopatternable organic material, as was investigated by Gach et al. (*Biomaterials*. 2010 November; 31(33): 8810-8817). This approach can be used to vary the remanent magnetization of the microcomponent independently from the magnetically susceptible layer thickness or volume. Transparent magnetic layers may also enable potentially desirable optical properties for light-emitting devices.

Figure 4:
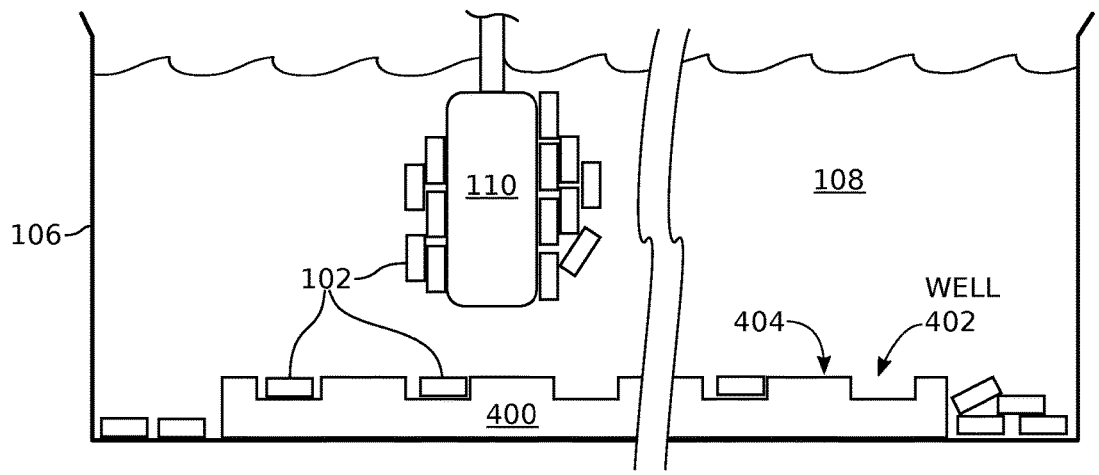
FIG. 4 is a diagram depicting a variation of the distribution system of FIG. 1 being used as part of a fluidic assembly process.

FIG. 4 is a diagram depicting a variation of the distribution system of FIG. 1 being used as part of a fluidic assembly process. In this aspect, a substrate 400 is submerged in the solution 108. A plurality of microcomponent wells 402 is formed in the substrate surface 404. The electromagnetic collection head 110 is immersible in the solution 108 and capable of the release of magnetically captured microcomponents over the substrate surface for assembly into the substrate wells. In addition, the collection head 110 is capable of capturing of microcomponents 102 unseated in the substrate wells 402.

Figure 5:
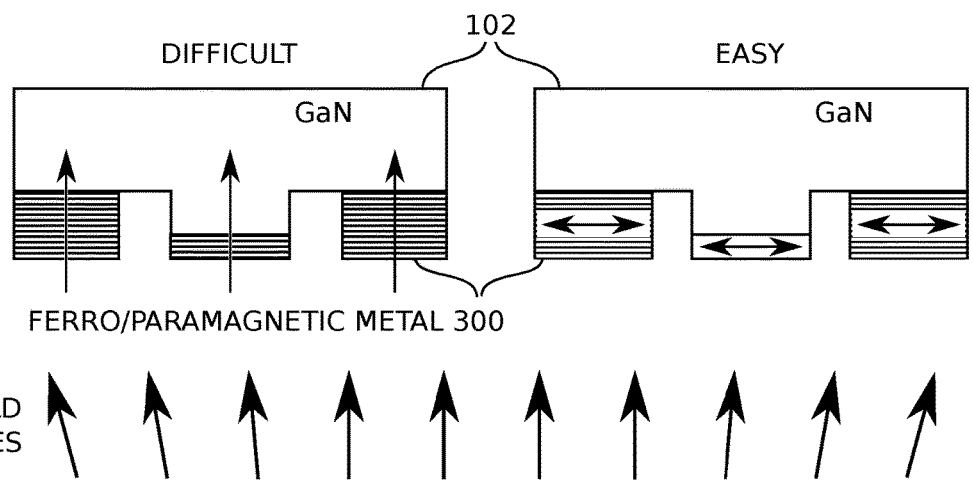
FIG. 5 depicts axes of microcomponent magnetization for a thin magnetic film.

FIG. 5 depicts axes of microcomponent magnetization. In this example, the microcomponents are gallium nitride (GaN) light emitting diodes (LEDs) and the soft ferromagnetic layers 300 are part of the device electrodes and of a thickness less than the threshold thickness for easy orthogonal magnetization.

Two qualitatively distinct regimes exist in magnetically-susceptible microstructures, related to the instability of aligned magnetic domains in ferromagnetic thin films. Feldkeller (J Phys. Colloques 32, C1-452 (1971) describes easy axes of magnetization that arise for films below a threshold thickness. Both above and below this threshold thickness, ferromagnetic materials can sustain magnetization, but the susceptibility for films below the threshold thickness tends to demonstrate easy-axes aligned within the film plane. This magnetization anisotropy gives rise to distinct behavior of thin film-patterned microdevices. At thicknesses sufficiently above the threshold thickness, ferromagnetic thin films behave similarly to bulk-scale ferromagnets and can be magnetized orthogonal to the ferromagnetic film plane. For example, the critical thickness is ~600 nm for nickel and ~300 nm for Ni—Fe.

Figure 6A:
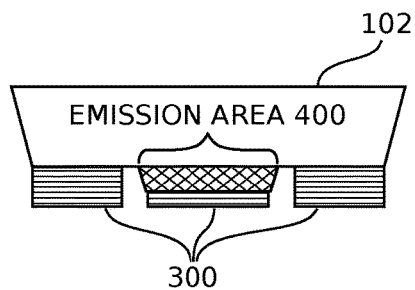
FIGS. 6A through 6D are partial cross-sectional views depicting variations in the orientation of the soft ferromagnetic layer.
Figure 6B:
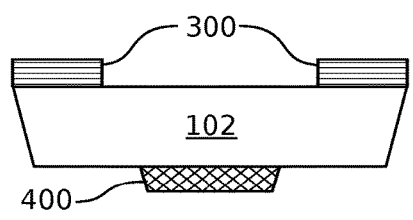

FIGS. 6A through 6D are partial cross-sectional views depicting variations in the orientation of the soft ferromagnetic layer. The soft ferromagnetic layer (e.g., nickel) may be integrated into LED device electrodes as shown in FIGS. 6A and 6B, or added as auxiliary features as shown in FIGS.

6C and 6D. Also shown is the LED emission area 400. In FIG. 6A, the soft ferromagnetic layer electrodes 300 underlie the (flip-chip) LED 102, and the emission area 400 may be formed over the center electrode or over the outer electrode. As part of the conduction path, the ferromagnetic material in this configuration has the least impact on light generated at the quantum wells. In FIG. 6B, with the electrodes 300 enabled as a patterned annulus on the top surface of a (vertical) LED 102, this configuration restricts top emission area to a smaller area and may be used where a smaller emitter aperture is desired. Light emission experiences low-scattering when the multiple quantum well layer is smaller than, and concentric with, the aperture. In the limit of a blanket deposition (removal of central film opening), light may be forced predominantly outwards from the emitter sidewall(s). This configuration may be desirable for thin optical devices with a need for diffuse light emission such as backlights.

Figure 6C:
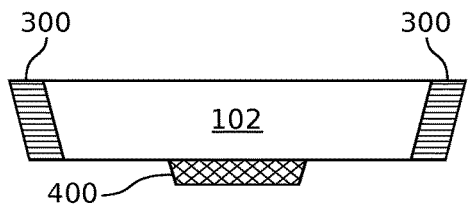

With the soft ferromagnetic layer electrodes 300 enabled as a coating on the µLED sidewall 402 in FIG. 6C, forward-fluence is enhanced. While more challenging from a fabrication standpoint, this configuration may be desirable due to the improved external efficiency and the ability to achieve out-of-device-plane magnetization for ferromagnetic films below the thickness threshold for magnetic isotropy.

Figure 6D:
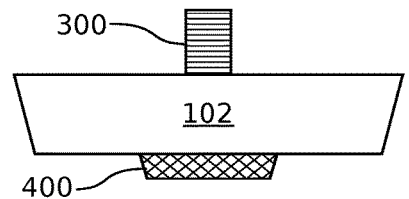

In FIG. 6D, a post-shaped soft ferromagnetic layer additional acts as an orientation structure, as explained in parent patent U.S. Pat. No. 9,825,202, entitled DISPLAY WITH SURFACE MOUNT EMISSIVE ELEMENTS, invented by Schuele et al. This post electrode 300 also acts to optically scatter light emission.

In a reduction to practice, a structure similar to the one depicted in FIG. 6A was fabricated with a 200 nm thickness of Ni and a total planar cross-sectional area of 968 µm$^2$ on a 45 µm diameter, 5 µm thick µLED. This structure was responsive to the methods of magnetization, motion, and orientation described above under the influence of a ~1000 gauss magnetic field at various distances. Though magnetization was predominantly directed out-of-plane, the magnetic material was below the threshold thickness for magnetic isotropy (~600 nm for Ni) and the µLEDs were magnetized in the plane of the deposited metal in accordance with the theory on easy magnetization axes. While Ni is desirable for its simplicity and relatively low coercivity, alternatives materials are readily available, such as permalloy (Ni—Fe alloy with lower critical thickness threshold and lower coercivity). The technique is not limited to a particular material selection or device geometry, but may be modified to optimize handling and yield.

Figure 7:
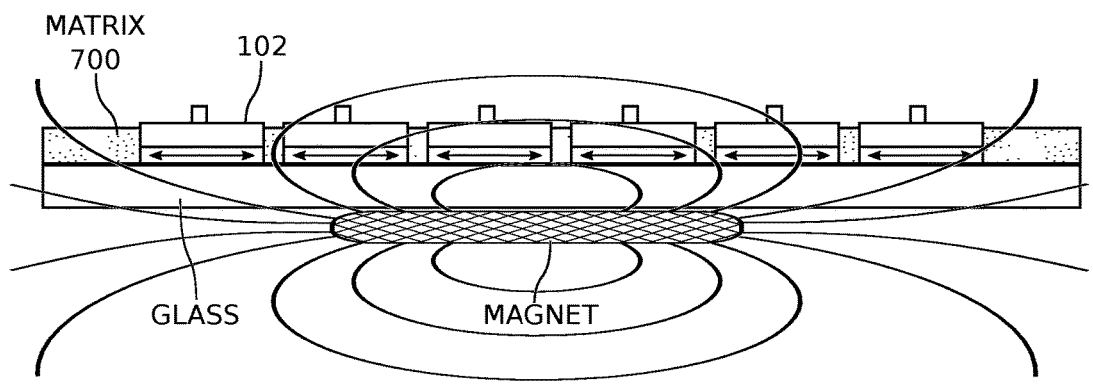
FIG. 7 schematically depicts a procedure for magnetizing microcomponents immobilized in a dissolvable matrix prior to suspension.

FIG. 7 schematically depicts a procedure for magnetizing microcomponents immobilized in a dissolvable matrix 700 (e.g., wax) prior to suspension. Due to the thermal, chemical, and electromagnetic exposure during processing, the susceptible microcomponents are magnetized with the desired dipole direction as the final step prior to harvest into suspension. For uniformity, the microcomponents 102 are magnetized by exposure to a magnetic field sufficient to saturate magnetization in the susceptible material.

Preferably, the ferromagnetic material has a sufficiently low coercivity so that magnetization decreases significantly after the external magnetic field is removed. This is desirable to reduce the effect of microcomponent aggregation in suspension. Magnetization may be achieved with either a permanent magnet or with an electromagnet.

The risk of remagnetization in an unintended direction is low due to the low rotational inertia of microcomponents—rather than remagnetize, they tend to reorient and align their magnetic field with the external field. The material and dimensions of the magnetic film may be optimized to balance magnetic attraction sensitivity with microcomponent agglomeration prevention under the fluid flow conditions used in assembly. The direction of magnetization depends on the assembly and handling approach desired. For microcomponents with ferromagnetic layers thicker than the critical thickness, the magnetization direction may be chosen to enable selection of influence. For example, if low-shear of attracted components at high magnetic flux and up/down orientation control is desired, microcomponents may be magnetized perpendicular to their top surface.

Figure 8A:
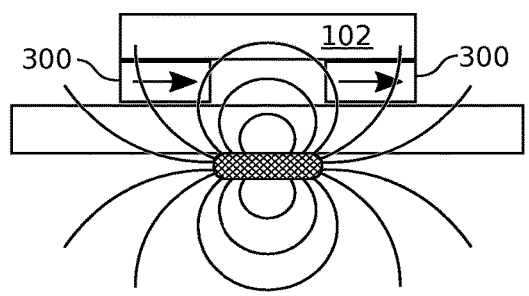
FIGS. 8A and 8B are, respectively, a partial cross-sectional and plan (underneath) view of an asymmetrically shaped microcomponent.
Figure 8B:
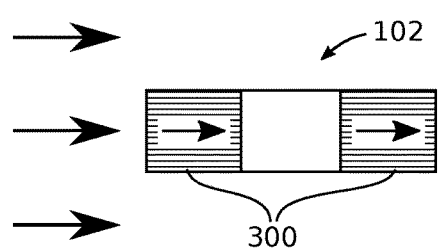

FIGS. 8A and 8B are, respectively, a partial cross-sectional and plan (underneath) view of an asymmetrically shaped microcomponent. If theta (in-plane orientation) control is desired to enable control over electrode direction, the magnetization can be parallel to the top surface and registered to microcomponent asymmetry as shown. Magnetization at an intermediate angle to orient the microcomponent both in-plane and out-of-plane is also possible, but challenging to implement without creating a tendency of the microcomponent to tip out of the substrate wells.

For ferromagnetic layers below the critical thickness threshold, magnetization is limited to the component's easy axes, but the geometry of the ferromagnetic heterostructure may still allow magnetization out of plane, as in the sidewall deposition shown in FIG. 6C. As used herein, a "ferromagnetic heterostructure" is intended to describe a structure including a ferromagnetic layer or part.

Subsequent to the induced magnetization of the microcomponents, or as the final step before magnetic release, microcomponents may be immobilized by a strong magnetic attractive force while being chemically treated. This chemical treatment may be a simple clean that uses solvent to remove any photoresist, adhesives, etc. used in processing, or may be used to modify the hydrophilic/hydrophobic character of the microcomponent, or to modify electrodes. The ability to secure singulated microcomponents from suspension provides a selective method of segregating and treating the microcomponents while enabling great freedom in selecting the carrier fluid of the suspension.

Once the magnetized microcomponents are rinsed to suspension after chemical treatment, they may be collected in a supply reservoir with the components from other growth wafers, providing a unified source for assembly. Suspensions of dense particles are notoriously difficult to handle through standard pipes and fittings due to the tendency of particles to collect at regions of low flow velocity. Additionally, the high force that may be necessary to prevent or clear these collections can easily break the fragile, unpackaged microcomponents. For this reason, the practical handling of microcomponents requires the application of an external force exceeding the viscous shear force and the frictional force for settled components. Best practice is also to limit potential dead-zones in distribution networks where microcomponents may collect.

Figure 9:
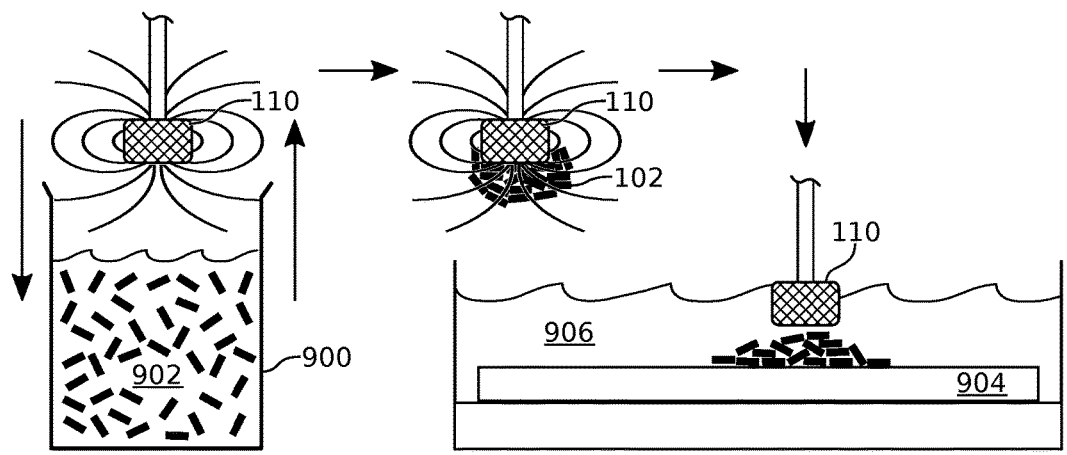
FIG. 9 depicts the process of distributing microcomponents from a supply reservoir to a substrate for assembly.

FIG. 9 depicts the process of distributing microcomponents from a supply reservoir to a substrate for assembly. Magnetization provides advantages for the practical handling of microcomponents. Transferring microcomponents, from supply reservoir 900 with microcomponents in solution 902 to an assembly substrate 904 in environment 906, may be accomplished via a bulk pick-up head 110 that need not be selective for registration or quantity of microcomponents. Environment 906 may be a gaseous (e.g., air or $N_2$), or a solution environment. A coated magnetically energized pick-up head 110 is submerged into the supply reservoir 900, which may be agitated to suspend settled microcomponents, attracts a large population from suspension 902, and holds them against the coated surface. Once secured, the pick-up head 110 transfers the microcomponents 102 to the assembly substrate 904 where they are released either by de-energizing the magnetic field or by briefly reversing the field polarity to dislodge the microcomponents, with optional vibration.

Figure 10:
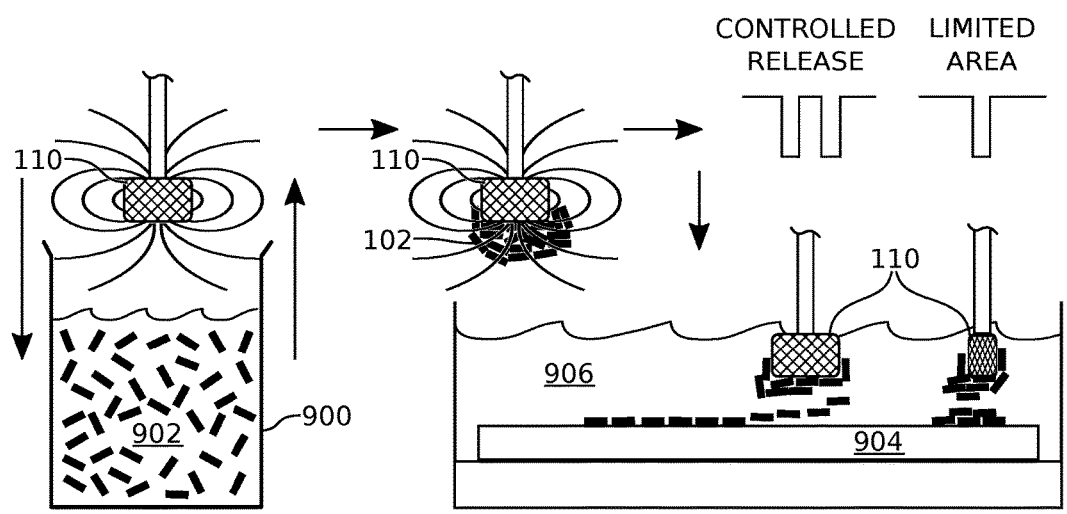
FIG. 10 depicts an additional refinement to the distribution process shown in FIG. 9.

FIG. 10 depicts an additional refinement to the distribution process shown in FIG. 9. After the pickup head 110 translates over the assembly substrate area, the microcomponents 102 are distributed with an oscillating magnetic field whose amplitude and period is balanced to release a portion of microcomponents per cycle. In a further refinement, the oscillation waveform frequency and duty cycle may be modified along with the collection head translation to achieve a more uniform distribution or to distribute microcomponents to selected regions of the substrate 904.

Once magnetized microcomponents are distributed on the assembly substrate having a plurality of recesses that may retain settled microcomponents, the microcomponents may be impelled by methods disclosed in parent application Ser. No. 15/412,731, entitled SYSTEM AND METHOD FOR THE FLUIDIC ASSEMBLY OF EMISSIVE DISPLAYS, invented by Sasaki et al., or directly by a translating spatially heterogeneous attractive magnetic driver. This magnetic driver approach is similar to patent U.S. Pat. No. 7,217,592 in that microstructures are assembled to patterned recesses via agitation by an external magnetic field. Where the prior art assembly relied on a long-range attractive force in the form of magnetic flux leakage at the recess openings of the guide layer, the current approach does not rely on long-range attraction between the microcomponent and the recess. Additionally, where patent U.S. Pat. No. 7,217,592 uses a hard magnetic layer at the recess bottom, the methods disclosed herein avoid permanent magnetic attractive forces on the assembly substrate which result in poor selectivity (i.e. more than 1 microcomponent trapped per recess).

Figure 11:
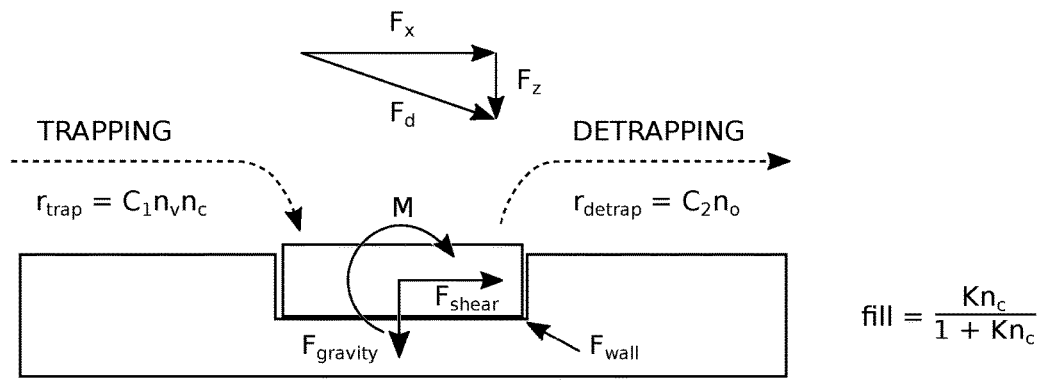
FIG. 11 is a microcomponent free-body diagram.

FIG. 11 is a microcomponent free-body diagram. The specific considerations of fluidic assembly to recesses are covered in detail in parent application Ser. No. 15/722,037, entitled MICROPERTURBATION ASSEMBLY SYSTEM AND METHOD, invented by Sasaki et al. Reducing the detraping rate for assembled microcomponents is a particularly motivating factor for magnetically-impelled assembly.

Figure 12A:
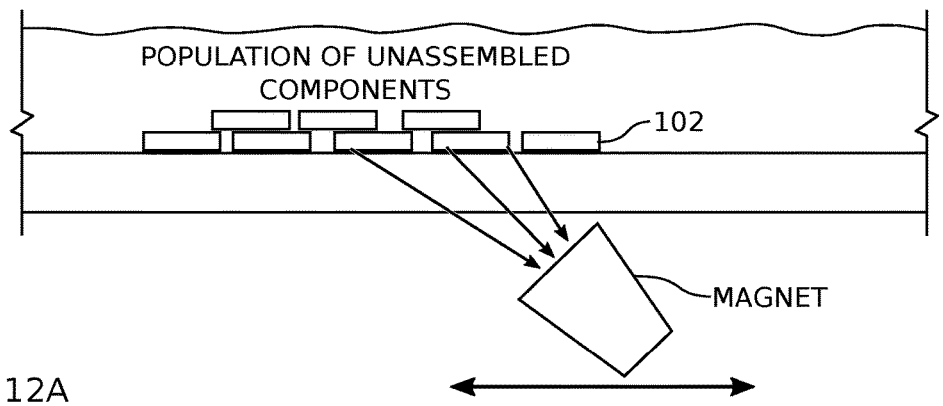
FIGS. 12A and 12B depict aspects of an attractive driver method of assembly using magnetic force to pull components towards and across an assembly substrate.
Figure 12B:
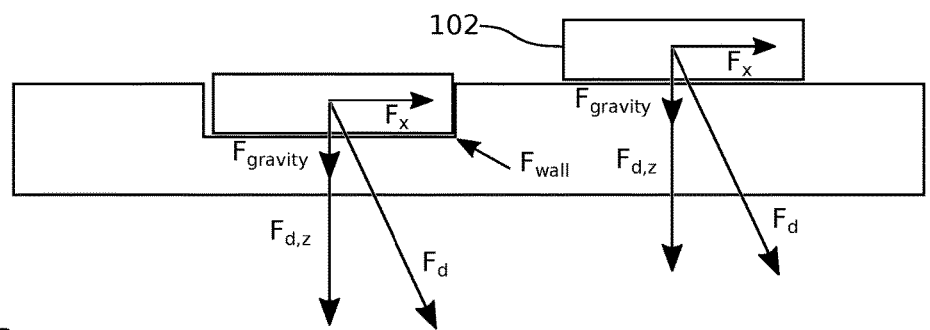

FIGS. 12A and 12B depict aspects of an attractive driver method of assembly using magnetic force to pull components towards and across an assembly substrate. FIG. 12A schematic shows a translating driver pulling exerting force on components for assembly. FIG. 12B is a free-body diagram demonstrating how attractive assembly improves yield by increasing trapping force with a low risk of upward detrapping force. Rather than using viscous shear forces to perturb microcomponents on the substrate surface until they assemble, assembly to recesses (wells) can be achieved using a spatially heterogeneous attractive force located and translated below the substrate surface as shown. Since the attractive force acts on the microcomponents directly, turbulence in the assembly fluid becomes vanishingly small, and microcomponents may be translated laterally. The downward trapping force is enhanced beyond the small gravitational force experienced by the microcomponent as shown in the diagram in FIG. 12B. A strong magnetic field generator is then placed close to the bottom of the substrate and attracts microcomponents. With spatial heterogeneity, the magnetic field generator can induce lateral motion in unassembled microcomponents while assembled microcomponents are retained in their recesses.

The attractive driver or array of drivers may be translated under the surface at significant speed to induce perturbations in the population of microcomponents resulting in assembly to recesses, then slowed to exert a more steady force to translate unassembled microcomponents away from the assembly area after 100% of recesses are occupied. As the downward trapping force is enhanced with this method, the threshold for lateral microcomponent momentum is accordingly raised, which results in a two-fold benefit: increased trapping rate and decreased detrapping rate. As the attractive driver also induces additional normal force on the microcomponents, frictional force is enhanced and may be mitigated via ultrasonic vibration of the substrate as described in the parent application entitled, MICROPERTURBATION ASSEMBLY SYSTEM AND METHOD, Ser. No. 15/722,037.

Figure 13A:
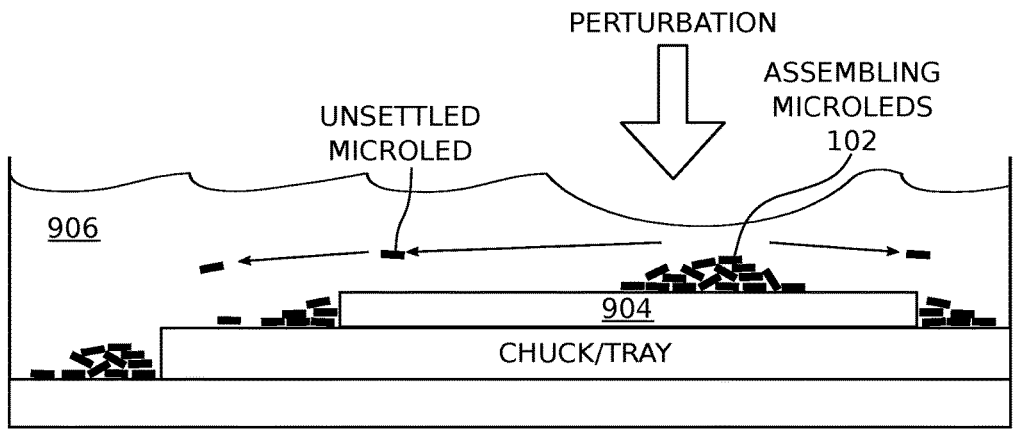
FIGS. 13A and 13B depicts steps in a method for using a magnetic field to reclaim unseated microcomponents, to prevent their escaping in the removal of excess suspension fluid.
Figure 13B:
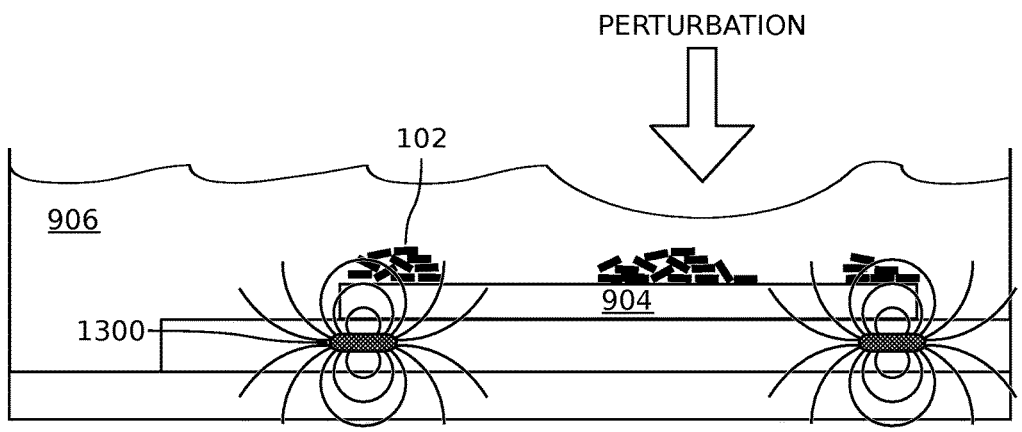

FIGS. 13A and 13B depicts steps in a method for using a magnetic field to reclaim unseated microcomponents, to prevent their escaping in the removal of excess suspension fluid or in the perturbation process used for assembly. This recovery method is applicable regardless of whether an attractive driver or other methods, such as agitation or current flow, were used to seat the microcomponents on a substrate. FIG. 13A is a cross section of a fluidic assembly system showing the path of excess microcomponents 102. FIG. 13B shows how magnetic fields can capture excess microcomponents 102 on the assembly substrate 904.

Figure 14A:
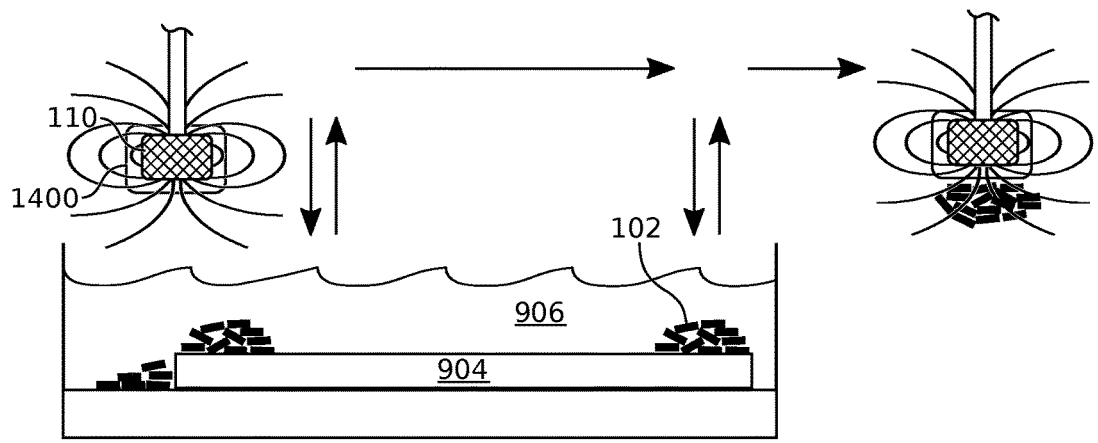
FIGS. 14A through 14C depict steps in the collection of unseated microcomponents for recycling.
Figures 14B, 14C:
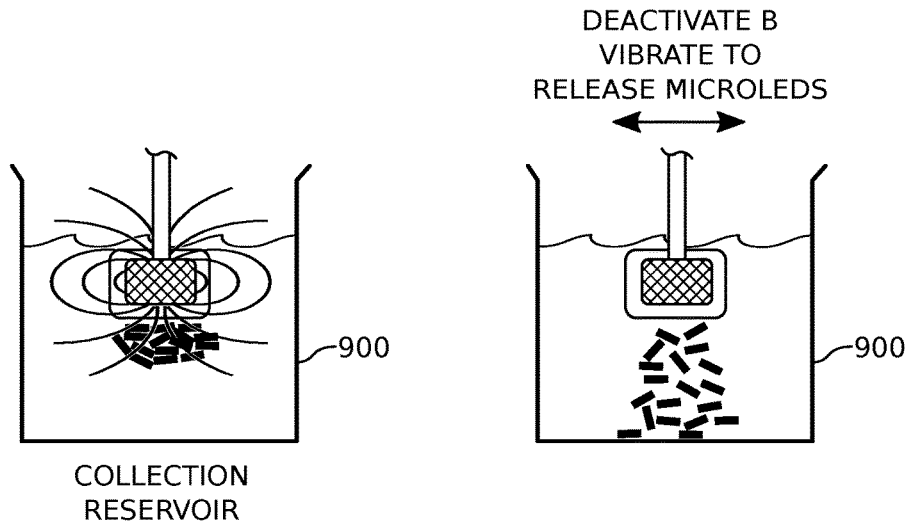

FIGS. 14A through 14C depict steps in the collection of unseated microcomponents for recycling. Recycling of microcomponents is an important requirement for low-cost fluidic assembly so all the excess microcomponents can be captured while also maintaining the purity of the suspension by, for example, excluding particles and broken fragments. Excess suspension fluid typically flows off the assembly substrate into a capture basin where it can be difficult to recapture the microcomponents that settle to the bottom and collect in low flow regions at corners. However, magnetically enhanced microcomponents can be captured by magnets 1300 at the edge of the product substrate as shown in FIG. 13B, where it is easier to capture and recycle them. FIGS. 14A-14C build on this process showing a system that uses magnetic fields to collect microcomponents from the edges of the substrate.

Figure 15A:
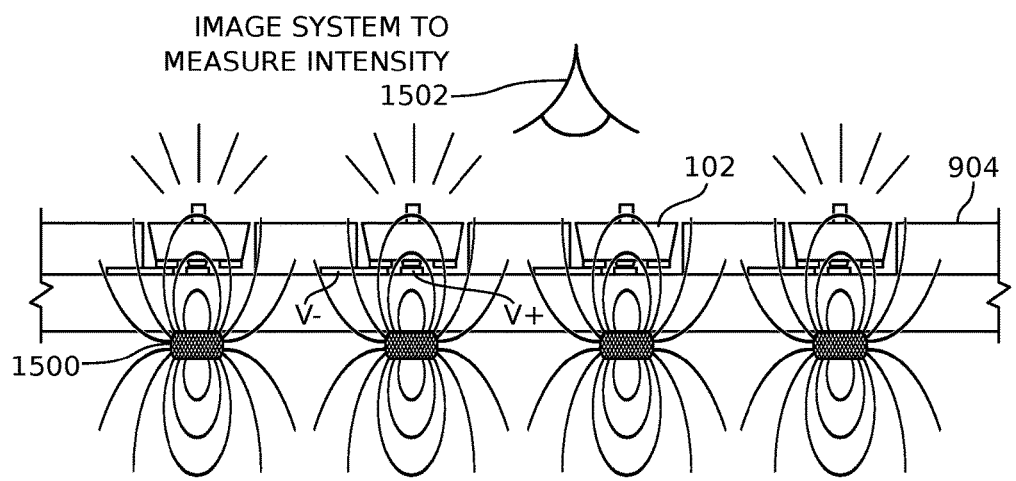
FIGS. 15A and 15B depict an apparatus for removing defective microcomponents (e.g., μLEDs) based on functional test (FIG. 15A) and selective removal (FIG. 15B).

After stochastic assembly of microcomponents to a large area, a significant population of unassembled residual microcomponents on the surface of the assembly substrate is generally unavoidable. Leaving the microcomponents would create optical defects, interfere with subsequent processing and packaging, and increase cost through poor utilization of microcomponents. Energetically removing the microcomponents from the surface, however, risks detrapping assembled microcomponents, and thus reducing yield. This risk may be minimized by selectively enhancing the holding force on assembled microcomponents beyond the force of gravity. For this application, an array of short-range electromagnets registered to the recesses in the assembly substrate is located on the opposite side of the recesses such as shown in FIG. 15A. The arrayed electromagnets can provide a small, but significant, force on assembled microcomponents. The direction of the magnetic field provided by the array is determined by the desired application. For in-plane orientation control, the energized magnetic field points parallel to the assembly substrate plane. For out-of-plane orientation control, the magnetic field may point perpendicular to the surface. This has the added advantage of dislodging assembled upside-down microcomponents. The array may be energized during assembly or during the final cleanoff step. The final cleanoff step involves the removal of any misaligned microcomponents as well as the assembly fluid. With sufficient holding force provided by the electromagnet array, a strong transverse force may be applied to the assembly substrate surface with minimized detrapping of microcomponents assembled in the recesses. In some aspects, a rotating brush, a sliding microporous sheet, or a relatively high velocity flow of liquid over the surface may be used to sweep away unassembled microcomponents into an assembly trough.

A magnetic probe or collection head 110 with a non-stick coating 1400 is used to collect excess microcomponents 102 from the substrate 904 and transfer them to a collection reservoir 900. The head surface 116 coating (e.g., Teflon) 1400 may be optimized to minimize Van der Wags stiction of microcomponents 102. The advantage of this recycling tactic is the comparative simplicity of the fluidics where there are no geometries to trap microcomponents which would cause yield loss. The microcomponents 102 may be removed from the collection head 110 by deactivating the magnetic field and, optionally, vibrating the collection head.

Figure 15B:
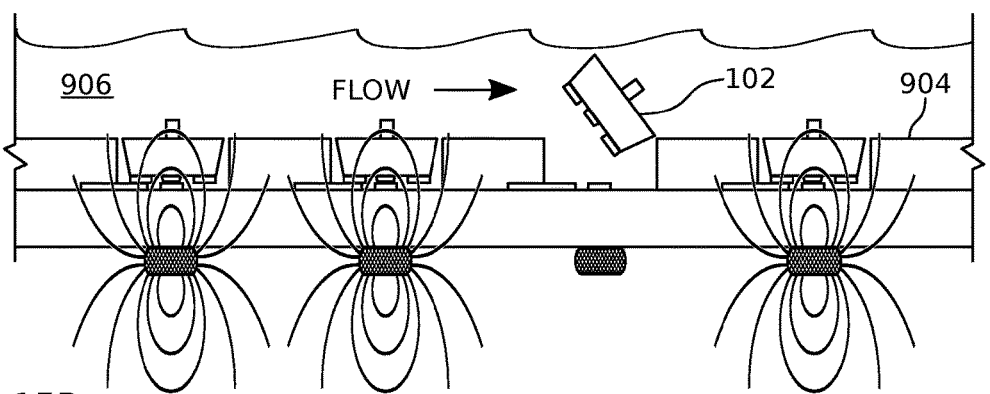

FIGS. 15A and 15B depict an apparatus for removing defective microcomponents (e.g., µLEDs) based on functional test (FIG. 15A) and selective removal (FIG. 15B). An array of electromagnets 1500 can also apply sufficient force to flip-chip µLED microcomponents 102, so that moderately low contact resistance may be achieved when the substrate's electrodes are energized. In this manner, the function of assembled components may be assessed prior to permanent bonding through, for instance, a temporary liquid phase bond such as with eutectic solder. Non-functional microcomponents may be identified in a parallel manner using an imaging system 1502 to measure light intensity and subsequently removed by interrupting or reversing the magnetic field holding the non-functional microcomponent 102, and then sweeping away the non-functional microcomponent using solution 906.

In a further refinement, this light-on test can be performed during assembly. After, or during, an initial assembly, the electromagnet array can be energized to hold microcomponents against the electrodes which are then energized, and imaging infrastructure 1500 identifies defects as shown in FIG. 15A. The electromagnet array is addressed to release non-functional microcomponents, making the recess available for assembly of a different component as shown in FIG. 15B. The electromagnet associated with the now-empty recess would then revert to the normal polarity and assembly could continue until a 100% yield was achieved.

Identifying nonfunctional assembled microcomponents before the step of permanent bonding has a secondary benefit in allowing the binning of nonfunctional microcomponents. In one aspect, a high-density of recesses in a test substrate are assembled to moderate, but not necessarily 100%, fill. Providing an excess of recesses allows assembly with few remaining unassembled microcomponents. After this assembly, the approach outlined above can selectively retain either functional or non-functional microcomponents while the other population is ejected from the test substrate and collected either for use in true devices or examined for failure analysis and quality control. The reason a separate test substrate may be desired, instead of simply using the true device substrate, is that the electrodes that enable the lowest resistance for temporary contact (e.g., gold) may be different than the true device substrate electrodes. Optimizing for microcomponent validation through a temporary contact light-on test is a narrower design target than would exist for a product's assembly substrate. Lastly, to ensure that ejected microcomponents do not re-trap in recesses, the substrate may be vibrated, tilted, or inverted as the selected population is ejected.

Further, the magnetized microcomponents need to be permanently bonded to the final substrate prior to packaging. In conventional manufacturing, surface mount devices are bonded through a method such as reflow with solder paste. For microcomponents, however, the self-pressure from gravity is often less than 1 Pascal (Pa), which makes achieving good contact in a temporary liquid-phase bonding process heavily reliant on controlling the wetting angle between the liquid phase material and the surface to be bonded. It is desirable to exert additional force during bonding to achieve good contact between the liquid phase and solid bond pads, and while some investigators apply compressive force using an elastomeric stamp, the risk of defects, sticking, and registration make this a cumbersome approach for fluidically assembled devices. In a similar manner to the holding force scheme described in FIGS. 15A and 15B, the magnetic microcomponents can be held during elevated temperature anneal. The Curie temperature at which the components lose magnetization is above the anneal temperature so even though the magnetic force is expected to be diminished, it still provides a significantly more powerful force than could be achieved from gravity alone. This force can be provided either by the array of electromagnets 1500 shown in FIGS. 15A and 15B, or by a wide-area uniform magnetic field, as spatial selectivity is not necessary for this step.

Figure 16A:
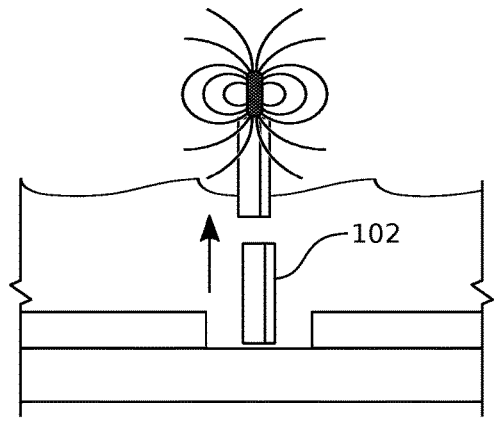
FIGS. 16A and 16B depict the use of an electromagnetic collection head to aid in the removal of defective microcomponents.
Figure 16B:
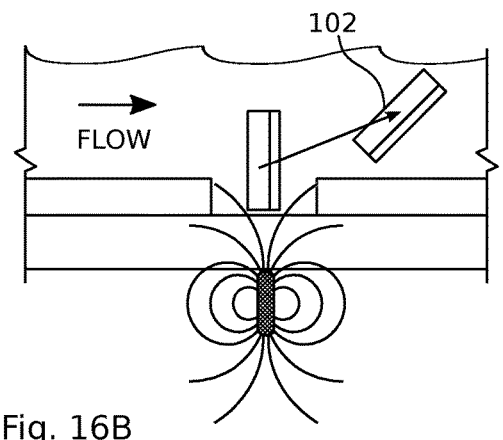

FIGS. 16A and 16B depict the use of an electromagnetic collection head to aid in the removal of defective microcomponents. It has been observed that microcomponents with magnetic layers magnetized in the plane of the device rotate to a vertical orientation in response to a vertical magnetic field. So an alternate method of removing non-functioning microcomponents uses this property to directly capture a microcomponent 102 with a magnetic probe as shown in FIG. 16A. For example, the collection head 110 can be used to pull defective microcomponents from substrate wells. Alternatively, a magnetic field below the substrate may be used to push a defective microcomponent into a vertical orientation where the force of fluid flow can remove the microcomponent from the well and sweep it away.

Figure 17:
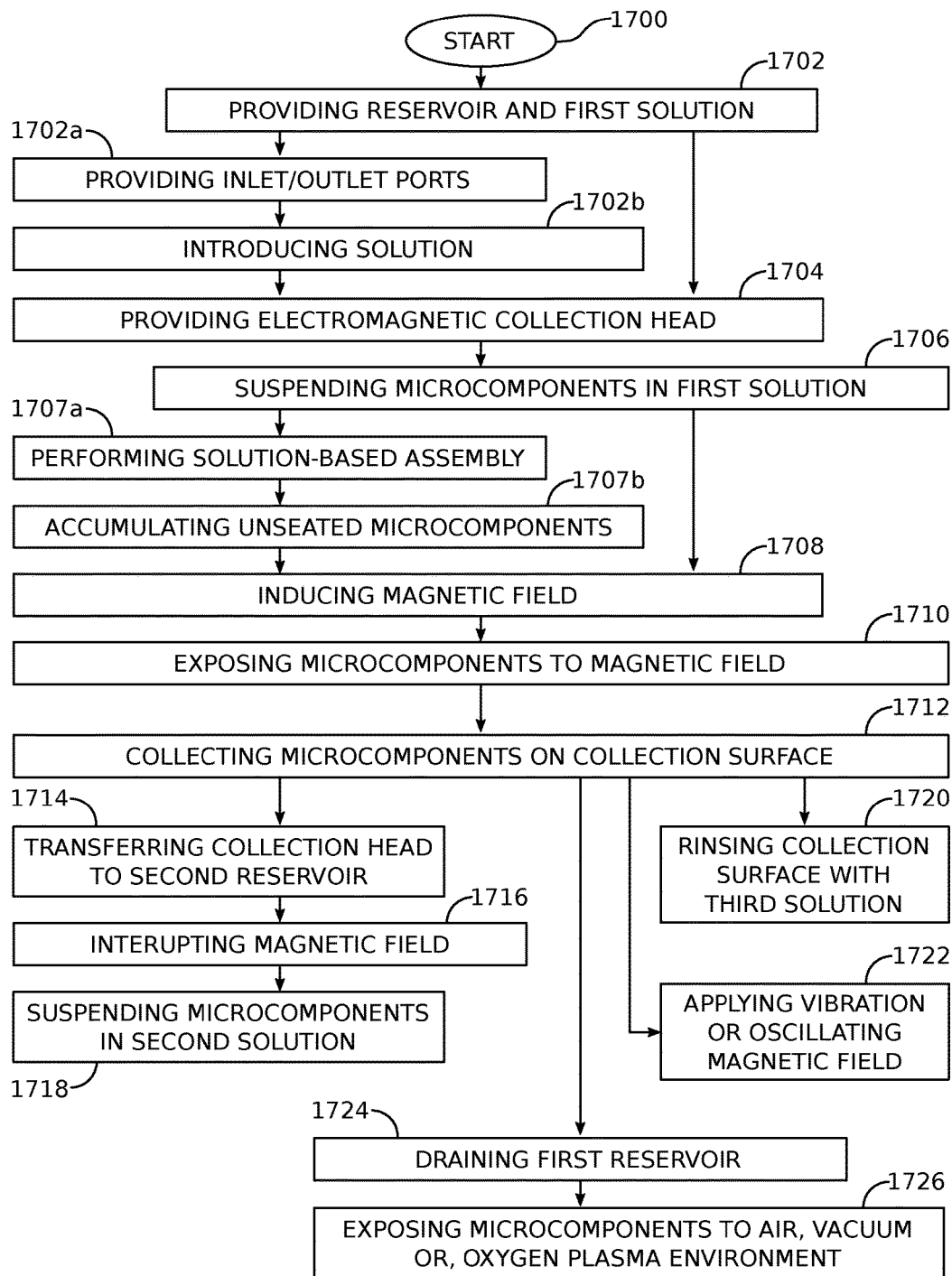
FIG. 17 is a flowchart illustrating a fluid-suspended microcomponent management method.

FIG. 17 is a flowchart illustrating a fluid-suspended microcomponent management method. Although the method is depicted as a sequence of numbered steps for clarity, the numbering does not necessarily dictate the order of the steps. It should be understood that some of these steps may be repeated, skipped, performed in parallel, or performed without the requirement of maintaining a strict order of sequence. Generally however, the method follows the numeric order of the depicted steps. The method starts at Step 1700.

Step 1702 provides a first reservoir containing a first solution. The first solution may be an alcohol, ketone, alkane, organic acid, or water. Step 1704 provides a collection head, which may be electromagnetic or permanently magnetized. Step 1706 suspends a plurality of magnetically polarized microcomponents in the first solution, where each microcomponent has a maximum cross-section of 150 µm and a maximum mass of 1 microgram. Step 1708 induces a magnetic field in the collection head. Note: Step 1708 may be performed before Step 1706. Step 1710 exposes the microcomponents to the magnetic field. Step 1712 fixes a plurality of microcomponents in position on a collection surface in response to the magnetic field.

In one aspect, exposing the microcomponents to the magnetic field in Step 1710 includes immersing the collection head in the first reservoir. Then, fixing the plurality of microcomponents in position in Step 1712 includes collecting the plurality of microcomponents on a surface of the collection head. Alternatively, providing the first reservoir in Step 1702 includes providing the first reservoir with a collection surface sidewall, and fixing the plurality of microcomponents in position in Step 1712 includes locating the electromagnetic collection head adjacent to an exterior of the collection surface sidewall and fixing the microcomponents in position on the collection surface sidewall.

In one aspect, the microcomponents have a planar soft ferromagnetic layer of thickness in the range of 50 to 2000 nm, and suspending the plurality of microcomponents in the first solution in Step 1706 includes the microcomponents having a magnetic polarization aligned either in parallel with the soft ferromagnetic layer or orthogonal to the soft ferromagnetic layer. Then, collecting the microcomponents on the collection surface in Step 1712 includes collecting the soft ferromagnetic layers of the microcomponents in an orientation of either parallel with or orthogonal to a planar collection surface. More explicitly, the microcomponents on the collection surface may be arranged in a sub-layer, made up of microcomponents with soft ferromagnetic layers having a parallel magnetic polarization, or in multiple layers, made up of microcomponents with soft ferromagnetic layers having an orthogonal magnetic polarization.

In one aspect, subsequent to collecting the plurality of microcomponents on the collection head surface in Step 1712, Step 1714 transfers the collection head from the first reservoir to a second reservoir containing a second solution. Step 1716 interrupts the magnetic field, and step 1718 suspends the microcomponents in the second solution in response to interrupting the magnetic field and releasing captured microcomponents from the collection head surface. The interruption of the magnetic field in Step 1716 may take the form of canceling the magnetic field, reversing the polarity of the magnetic field, or selectively de-energizing the magnetic field by using an oscillating magnetic field having a first frequency, first amplitude, and first duty cycle.

In another aspect, providing the first reservoir in Step 1702 includes providing the first reservoir containing the first solution with contaminants. Then, subsequent to collecting the plurality of microcomponents on the collection surface, Step 1720 rinses the collection surface with a third solution to remove the contaminants. Step 1720 may be performed by replacing the first solution with new solution that is either the same material or different than the first solution, or transporting microcomponents captured on a collection head surface to a different reservoir with clean solution. In one aspect, simultaneous with rinsing the collection surface in Step 1720, Step 1722 applies a force in the form of vibration or magnetic field oscillation to remove the contaminants.

In one aspect, providing the first reservoir in Step 1702 includes providing the first reservoir with a substrate submerged in the first solution, with the substrate having a plurality of microcomponent wells formed in a substrate surface. Prior to inducing the magnetic field in the collection head (Step 1708), Step 1707a performs a solution-based assembly process to seat microcomponents in the wells, and Step 1707b accumulates unseated microcomponents in the first reservoir. Then, collecting the plurality of microcomponents on the collection head surface in Step 1712 includes collecting the unseated microcomponents using the magnetic field.

In one aspect, providing the first reservoir containing the first solution includes substeps. Step 1702a provides a first reservoir with an inlet port and an outlet port, and Step 1702b introduces a solution to the first reservoir that may be the first solution, a second solution, or the first solution followed by the second solution. Note: Step 1702b need not necessarily be performed before Step 1706, and in fact, maybe be performed in many instances as the method proceeds through the above-described steps. For example, the microcomponents are initially captured in wax, rinsed with acetone to dissolve the wax, and then transferred to isopropanol (IPA). Without magnetic concentration, low dilutions are used on the exchanges, so the microcomponents may be rinsed with acetone three times and isopropanol three times—all in the same reservoir. If the microcomponents can be captured magnetically, the microcomponents need only be rinsed with acetone and IPA once, as holding the microcomponents in place permits a continuous introduction of clean fluids.

In one aspect, providing the electromagnetic collection head in Step 1704 includes providing the electromagnetic collection head with a proximal end bottom surface and a shear break wall formed around a perimeter of the proximal end bottom surface. Then, fixing the plurality of microcomponents in position in Step 1712 includes collecting the plurality of microcomponents on the proximal end bottom surface within the perimeter formed by the shear break wall.

In another aspect, Step 1724 drains the first reservoir of solution, and Step 1726 exposes the microcomponents fixed on the collection surface to an ambient air, vacuum, vapor-phase organic acids, or oxygen plasma environment.

Figure 18:
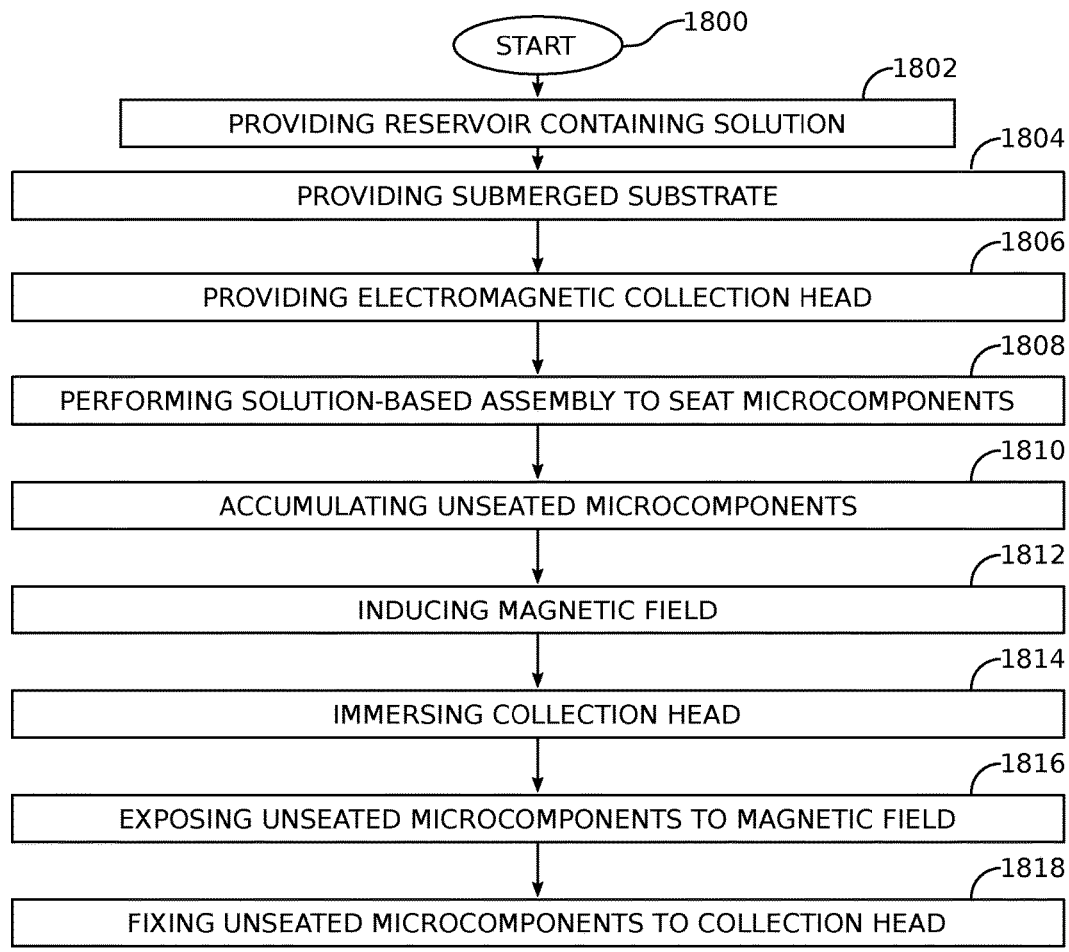
FIG. 18 is a flowchart illustrating a method for recovering unseated microcomponents in a solution-based deposition process.

FIG. 18 is a flowchart illustrating a method for recovering unseated microcomponents in a solution-based deposition process. The method begins at Step 1800. Step 1802 provides a reservoir containing a solution. Step 1804 provides a substrate submerged in the first solution having a plurality of microcomponent wells formed in a substrate surface. Step 1806 provides an electromagnetic collection head. Step 1808 performs a solution-based assembly process to seat microcomponents in the wells. Step 1810 accumulates unseated microcomponents in the reservoir. Step 1812 induces a magnetic field in the collection head, and Step 1814 immerses the collection head in the first solution. Note: Step 1814 may be performed before Step 1812. Step 1816 exposes the unseated microcomponents to the magnetic field. Step 1818 fixes a plurality of the unseated microcomponents in position on a collection head surface in response to the magnetic field.

Systems and methods have been presented for the magnetic management of fluid-suspended microcomponents. Examples of particular materials, dimensions, and tools have been presented to illustrate the invention. However, the invention is not limited to merely these examples. Other variations and embodiments of the invention will occur to those skilled in the art.

We claim:

1. A fluid-suspended microcomponent management method, the method comprising:
providing a first reservoir containing a first solution;
providing a magnetic collection head;
suspending a plurality of magnetically polarized microcomponents in the first solution, where each microcomponent has a maximum cross-section of 150 micrometers (μm), a maximum mass of 1 microgram, a planar soft ferromagnetic layer thickness in a range of 50 to 2000 nanometers (nm), and a magnetic polarization selected from the group consisting of aligned in parallel with the soft ferromagnetic layer and orthogonal to the soft ferromagnetic layer;
inducing a magnetic field in the collection head;
exposing the microcomponents to the magnetic field; and,
fixing a plurality of microcomponents in position on a collection surface in response to the magnetic field.

2. The method of claim 1 wherein exposing the microcomponents to the magnetic field includes immersing an electromagnetic collection head in the first reservoir; and,
wherein fixing the plurality of microcomponents in position includes collecting the plurality of microcomponents on a surface of the collection head.

3. The method of claim 2 wherein providing the electromagnetic collection head includes providing the electromagnetic collection head with a proximal end bottom surface and a shear break wall formed around a perimeter of the proximal end bottom surface; and,
wherein fixing the plurality of microcomponents in position includes collecting the plurality of microcomponents on the proximal end bottom surface within the perimeter formed by the shear break wall.

4. The method of claim 2 further comprising:
subsequent to collecting the plurality of microcomponents on the collection head surface, transferring the collection head from the first reservoir to a second reservoir containing a second solution;
interrupting the magnetic field; and,
suspending the microcomponents in the second solution in response to interrupting the magnetic field.

5. The method of claim 4 wherein interrupting the magnetic field includes an action selected from the group consisting of canceling the magnetic field, reversing the polarity of the magnetic field, and selectively de-energizing the magnetic field by using an oscillating magnetic field having a first frequency, first amplitude, and first duty cycle.

6. The method of claim 2 wherein providing the first reservoir includes providing the first reservoir with a substrate submerged in the first solution, having a plurality of microcomponent wells formed in a substrate surface;
the method further comprising:
prior to collecting the plurality of microcomponents, performing a solution-based assembly process to seat microcomponents in the wells;
accumulating unseated microcomponents in the first reservoir; and,
wherein collecting the plurality of microcomponents on the collection head surface includes collecting the unseated microcomponents using the magnetic field.

7. The method of claim 1 wherein collecting the microcomponents on the collection surface includes collecting the soft ferromagnetic layers of the microcomponents in an orientation selected from a group consisting of parallel with or orthogonal to a planar collection surface.

8. The method of claim 7 wherein orienting the microcomponents includes forming an arrangement of microcomponents on the collection surface selected from the group consisting of a sub-layer, made up of microcomponents with soft ferromagnetic layers having a parallel magnetic polarization, or multiple layers, made up of microcomponents with soft ferromagnetic layers having an orthogonal magnetic polarization.

9. The method of claim 1 wherein providing the first reservoir includes providing the first reservoir containing the first solution with contaminants;
the method further comprising:
rinsing the collection surface with a third solution to remove the contaminants.

10. The method of claim 9 further comprising:
simultaneous with rinsing the collection surface, applying a force to the collection surface, selected from the group consisting of vibration and magnetic field oscillation, to remove the contaminants.

11. The method of claim 1 wherein providing the first reservoir includes providing the first reservoir with a collection surface sidewall; and,
wherein fixing the plurality of microcomponents in position includes locating the magnetic collection head adjacent an exterior of the collection surface sidewall and fixing the microcomponents in position on the collection surface sidewall.

12. The method of claim 1 wherein providing the first reservoir containing the first solution includes:
providing a first reservoir with an inlet port and an outlet port; and,
the method further comprising:
introducing a solution to the first reservoir selected from the group consisting of the first solution, a second solution, and the first solution followed by the second solution.

13. The method of claim 12 further comprising:
draining the first reservoir of solution; and,
exposing the microcomponents fixed on the collection surface to an environment selected from the group consisting of an ambient air, vacuum, and oxygen plasma.

14. The method of claim 1 wherein providing the first reservoir containing the first solution includes providing a first solution selected from the group consisting of alcohols, ketones, alkanes, organic acids, and water.

15. A system for the distribution of magnetically polarized microcomponents, the system comprising:
magnetically polarized microcomponents, each microcomponent has a maximum cross-section of 150 micrometers (μm) and a maximum mass of 1 microgram;
a reservoir containing a solution, and comprising an inlet port to supply solution at a controlled rate and volume, and an outlet port to drain solution;
a magnetic collection head with a proximal end, a distal end, and a surface to enable the magnetic capture and release of the microcomponents in the solution; and,
wherein the solution is capable of creating shearing forces on magnetically captured microcomponents to remove weakly attached microcomponents and debris.

16. The system of claim 15 further comprising:
a gantry, with an arm attached to the distal end of the electromagnetic collection head, capable of moving the magnetic collection head in horizontal and vertical directions.

17. The system of claim 16 further comprising:
a substrate submerged in the solution, having a plurality of microcomponent wells formed in a substrate surface;
wherein the magnetic collection head is an electromagnetic collection head immersible in the solution and capable of an action selected from the group consisting of the release of magnetically captured microcomponents over the substrate surface for assembly in the substrate wells and the capture of microcomponents unseated in the substrate wells.

18. The system of claim 16 wherein the gantry includes a rotating member connecting the arm of the gantry.

19. The system of claim 16 wherein the gantry includes a vibrational actuator.

20. The system of claim 19 wherein the electromagnetic collection head bottom surface is planar and the shear break wall has a height in the range of 3 to 10,000 microns.

21. The system of claim 16 wherein the magnetic collection head proximal end includes a bottom surface and a shear break wall formed around a perimeter of the proximal end bottom surface.

22. The system of claim 15 wherein the microcomponents having a planar soft ferromagnetic layer, and a magnetic polarization selected from the group consisting of aligned in parallel with the soft ferromagnetic layer and orthogonal to the soft ferromagnetic layer; and,
wherein the electromagnetic collection head magnetically captures the soft ferromagnetic layers of the microcomponents in an orientation selected from a group consisting of parallel with or orthogonal to the electromagnetic collection head surface.

23. The system of claim 22 wherein the magnetic collection head surface magnetically captures microcomponents in an orientation selected from the group consisting of a sub-layer, made up of microcomponents with soft ferromagnetic layers having a parallel magnetic polarization, or multiple layers, made up of microcomponents with soft ferromagnetic layers having an orthogonal magnetic polarization.

24. The system of claim 15 wherein the magnetic collection head is an electromagnetic collection head inducing a magnetic field having a first frequency, first amplitude, and first duty cycle.

25. The system of claim 15 further comprising:
a vibration chuck underlying the reservoir.

26. The system of claim 15 wherein the magnetic collection head is capable of immersion in the solution.

27. The system of claim 15 wherein the magnetic collection head magnetically captures microcomponents against an interposing sidewall of the reservoir.

28. A fluid-suspended microcomponent management method, the method comprising:
providing a first reservoir containing a first solution with contaminants;
providing a magnetic collection head;
suspending a plurality of magnetically polarized microcomponents in the first solution, where each microcomponent has a maximum cross-section of 150 micrometers (µm) and a maximum mass of 1 microgram;
inducing a magnetic field in the collection head;
exposing the microcomponents to the magnetic field;
fixing a plurality of microcomponents in position on a collection surface in response to the magnetic field;
rinsing the collection surface with a third solution to remove the contaminants; and,
simultaneous with rinsing the collection surface, applying a force to the collection surface, selected from the group consisting of vibration and magnetic field oscillation, to remove the contaminants.

29. A fluid-suspended microcomponent management method, the method comprising:
providing a first reservoir containing a first solution with collection surface sidewalls;
providing a magnetic collection head;
suspending a plurality of magnetically polarized microcomponents in the first solution, where each microcomponent has a maximum cross-section of 150 micrometers (µm) and a maximum mass of 1 microgram;
inducing a magnetic field in the collection head;
exposing the microcomponents to the magnetic field;
locating the magnetic collection head adjacent an exterior of the collection surface sidewall and fixing the microcomponents in position on the collection surface sidewall in response to the magnetic field.

30. A system for the distribution of magnetically polarized microcomponents, the system comprising:
magnetically polarized microcomponents, each microcomponent has a maximum cross-section of 150 micrometers (µm), a maximum mass of 1 microgram, a planar soft ferromagnetic layer, and a magnetic polarization selected from the group consisting of aligned in parallel with the soft ferromagnetic layer and orthogonal to the soft ferromagnetic layer
a reservoir containing a solution;
a magnetic collection head with a proximal end, a distal end, and a surface to enable the magnetic capture and release of the microcomponents in the solution; and,
wherein the electromagnetic collection head magnetically captures the soft ferromagnetic layers of the microcomponents in an orientation selected from a group consisting of parallel with or orthogonal to the electromagnetic collection head surface.

31. The system of claim 30 wherein the magnetic collection head surface magnetically captures microcomponents in an orientation selected from the group consisting of a sub-layer, made up of microcomponents with soft ferromagnetic layers having a parallel magnetic polarization, or multiple layers, made up of microcomponents with soft ferromagnetic layers having an orthogonal magnetic polarization.

32. A system for the distribution of magnetically polarized microcomponents, the system comprising:
magnetically polarized microcomponents, each microcomponent has a maximum cross-section of 150 micrometers (µm) and a maximum mass of 1 microgram;
a reservoir containing a solution;
a magnetic collection head with a proximal end, a distal end, and a surface to enable the magnetic capture and release of the microcomponents in the solution; and,
wherein the magnetic collection head magnetically captures microcomponents against an interposing sidewall of the reservoir.

33. A system for the distribution of magnetically polarized microcomponents, the system comprising:
magnetically polarized microcomponents, each microcomponent has a maximum cross-section of 150 micrometers (µm) and a maximum mass of 1 microgram;
a reservoir containing a solution;
a magnetic collection head with a proximal end, a distal end, and a surface to enable the magnetic capture and release of the microcomponents in the solution; and,
a gantry, with an arm attached to the distal end of the electromagnetic collection head, capable of moving the magnetic collection head in horizontal and vertical directions, and with a vibrational actuator.

* * * * *